(12) United States Patent
Saigo

(10) Patent No.: US 11,785,686 B2
(45) Date of Patent: Oct. 10, 2023

(54) LED DRIVE CIRCUIT

(71) Applicant: Murata Manufacturing Co., Ltd., Nagaokakyo (JP)

(72) Inventor: Yumin Saigo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 129 days.

(21) Appl. No.: 17/504,565

(22) Filed: Oct. 19, 2021

(65) Prior Publication Data

US 2022/0039232 A1   Feb. 3, 2022

Related U.S. Application Data

(63) Continuation of application No. PCT/JP2020/019016, filed on May 12, 2020.

(30) Foreign Application Priority Data

May 28, 2019   (JP) ................................ 2019-099280

(51) Int. Cl.
*H05B 45/345* (2020.01)
*H05B 45/56* (2020.01)
(52) U.S. Cl.
CPC .......... *H05B 45/345* (2020.01); *H05B 45/56* (2020.01)
(58) Field of Classification Search
CPC ........ H05B 47/10; H05B 45/10; H05B 45/30; H05B 45/345; H05B 45/56
See application file for complete search history.

(56) References Cited

U.S. PATENT DOCUMENTS

| 8,111,011 B1 | 2/2012 | Tu et al. |
| 2010/0033113 A1 | 2/2010 | Maruyama et al. |
| 2013/0271018 A1* | 10/2013 | Luo ........................ H05B 45/44 |
| | | 315/192 |
| 2020/0166535 A1* | 5/2020 | Kitamura .................. G01F 1/69 |

FOREIGN PATENT DOCUMENTS

| CN | 205883643 U | 1/2017 |
| EP | 2312912 A2 | 4/2011 |
| JP | 08-032361 A | 2/1996 |
| JP | 11-298044 A | 10/1999 |
| JP | 2001-339286 A | 12/2001 |
| JP | 2009-267065 A | 11/2009 |
| JP | 2010-062349 A | 3/2010 |
| JP | 5079858 B2 | 11/2012 |

OTHER PUBLICATIONS

Official Communication issued in International Patent Application No. PCT/JP2020/019016, dated Aug. 4, 2020.

* cited by examiner

*Primary Examiner* — Jimmy T Vu
(74) *Attorney, Agent, or Firm* — KEATING & BENNETT, LLP

(57) ABSTRACT

An LED drive circuit includes a power supply terminal, an LED, a first switch, and a first resistor are connected in series. The power supply terminal, a third resistor, and a second switch are connected in series. A connection point between the third resistor and the second switch, and a control terminal of the first switch are connected. A second resistor is connected between a connection point between the first switch and the first resistor, and a control terminal of the second switch. A first PTC thermistor is connected to a connection point between the control terminal of the second switch and the second resistor.

13 Claims, 8 Drawing Sheets

LED DRIVE CIRCUIT

CROSS REFERENCE TO RELATED APPLICATIONS

This application claims the benefit of priority to Japanese Patent Application No. 2019-099280 filed on May 28, 2019 and is a Continuation Application of PCT Application No. PCT/JP2020/019016 filed on May 12, 2020. The entire contents of each application are hereby incorporated herein by reference.

BACKGROUND OF THE INVENTION

1. Field of the Invention

The present invention relates to an LED drive circuit that drives an LED.

2. Description of the Related Art

Light emitting diodes (LEDs) are widely used for various applications. For example, LEDs are used for headlights, tail lamps, interior lamps, and the like of automobiles. In such an LED mounted on an automobile, a battery is often used as a power supply.

A constant current circuit may be used to drive an LED. For example, Japanese Patent No. 5079858 discloses a constant current circuit for driving an LED. FIG. 9 illustrates the constant current circuit disclosed in Japanese Patent No. 5079858.

As illustrated in FIG. 9, a constant current circuit 1000 includes terminals 101 and 102, NPN transistors 103 and 104, and resistors 105 and 106. The terminal 101 is connected to each of a collector of the NPN transistor 103 and one end of the resistor 105. The other end of the resistor 105 is connected to each of a base of the NPN transistor 103 and a collector of the NPN transistor 104. An emitter of the NPN transistor 103 is connected to each of one end of the resistor 106 and a base of the NPN transistor 104, and each of the other end of the resistor 106 and an emitter of the NPN transistor 104 is connected to the terminal 102.

Here, a base-emitter threshold voltage of the NPN transistors 103 and 104, which is the threshold voltage at which the NPN transistors 103 and 104 change from an off state to an on state, is 0.6 V. That is, when the voltage applied to the bases of the NPN transistors 103 and 104 is less than 0.6 V, the NPN transistors 103 and 104 are turned off, and when the voltage applied to the bases of the NPN transistors 103 and 104 is 0.6 V or more, the NPN transistors 103 and 104 are turned on. In addition, the resistor 106 has a resistance value of 2Ω.

In the constant current circuit 1000, for example, the LED to be driven is connected to a point X between the terminal 101 and the collector of the NPN transistor 103.

When the terminal 101 is connected to a DC positive power supply and the terminal 102 is connected to a ground, the voltage of 0.6 V or more is applied to the base of the NPN transistor 103 via the resistor 105, and the NPN transistor 103 is turned on. As a result, current flows through the LED connected to the point X, and the LED is driven. As a result, the LED emits light. In addition, the current also flows through the resistor 106.

As described above, when the base-emitter threshold voltage of the NPN transistor 104 is 0.6 V and the resistance value of the resistor 106 is 2Ω, if the voltage value applied to the terminal 101 fluctuates, a current of about 300 mA always flows through the resistor 106. Then, the current of about 300 mA also always flows through the LED connected to the point X, limited to the current value of the current flowing through the resistor 106.

That is, since the resistance value of the resistor 106 is 2Ω, when the voltage applied to a point Y, which is a connection point between the emitter of the NPN transistor 103, the one end of the resistor 106, and the base of the NPN transistor 104, is 0.6 V, which is the base-emitter threshold voltage of the NPN transistor 104, a current value of the current flowing through the resistor 106 is 300 mA from the equation shown in Mathematical 1 below.

$$\text{Current value of current flowing through resistor } 106 = \frac{\text{Voltage value at point } Y}{\text{Resistance value of resistor } 106} = \frac{0.6(\text{V})}{2(\Omega)} = 300(\text{mA}) \quad \text{Mathematical 1}$$

When the current value of the current flowing through the resistor 106 is less than 300 mA, the voltage applied to the point Y is less than 0.6 V, and the NPN transistor 104 is turned off. On the other hand, when the current flowing through the resistor 106 is 300 mA or more, the voltage applied to the point Y is 0.6 V or more, and the NPN transistor 104 is turned on.

As described above, when the terminal 101 is connected to the DC positive power supply and the terminal 102 is connected to the ground, the NPN transistor 103 is turned on, and the current flows through the LED and the resistor 106. Then, when the current flowing through the resistor 106 becomes 300 mA or more, the voltage applied to the point Y becomes 0.6 V or more, and the NPN transistor 104 is turned on. Then, when the NPN transistor 104 is turned on, the voltage applied to the base of the NPN transistor 103 becomes less than 0.6 V, and the NPN transistor 103 is turned off. Then, when the NPN transistor 103 is turned off, the current does not flow through the LED and the resistor 106, the voltage applied to the point Y becomes less than 0.6 V, and the NPN transistor 104 is turned off. Then, when the NPN transistor 104 is turned off, the voltage of 0.6 V or more is applied to the base of the NPN transistor 103, and the NPN transistor 103 is turned on again. Then, the current flows through the LED and the resistor 106 again.

In the constant current circuit 1000, the above operation is repeated at high speed.

In the constant current circuit 1000, there is a problem that the base-emitter threshold voltage of the NPN transistor 104, which is the threshold voltage at which the NPN transistor 104 changes from the off state to the on state, has a temperature characteristic, and the threshold voltage fluctuates depending on the ambient temperature around the NPN transistor 104. More specifically, when the ambient temperature around the NPN transistor 104 increases, the base-emitter threshold voltage of the NPN transistor 104 decreases, and when the ambient temperature around the NPN transistor 104 decreases, the base-emitter threshold voltage of the NPN transistor 104 increases. For example, in the certain NPN transistor 104, every time the ambient temperature around the NPN transistor 104 increases by 1° C., the base-emitter threshold voltage of the NPN transistor 104 decreases by 0.002 V.

The decrease in the base-emitter threshold voltage of the NPN transistor 104 due to the increase in the ambient temperature around the NPN transistor 104 means that the current value of the current flowing through the LED becomes smaller than the design value due to the increase in the ambient temperature around the NPN transistor 104. Therefore, the constant current circuit 1000 has a problem that the current value of the current flowing through the LED decreases due to the increase in the ambient temperature around the NPN transistor 104, and the luminance of the LED decreases.

In addition, the constant current circuit 1000 has a problem that there is no mechanism for limiting the current value of the current flowing through the LED if the temperature of the LED becomes abnormally high. That is, in the constant current circuit 1000, if the temperature of the LED exceeds the junction temperature, the current having the high current value continues to flow through the LED, and thus there is a problem that the LED fails or the product life of the LED is shortened.

SUMMARY OF THE INVENTION

Preferred embodiments of the present invention provide LED drive circuits in each of which, if ambient temperature around a LED drive circuit fluctuates, current having a constant current value stably flows through an LED, so that the LED always emits light at a constant luminance.

A preferred embodiment of the present invention provides an LED drive circuit including a power supply terminal, an LED, a first switch, a second switch, a first resistor, a second resistor, and a third resistor. The power supply terminal, the LED, the first switch, and the first resistor are connected in series. The power supply terminal, the third resistor, and the second switch are connected in series. A connection point between the third resistor and the second switch, and a control terminal of the first switch are connected. The second resistor is connected between a connection point between the first switch and the first resistor, and a control terminal of the second switch. A first PTC thermistor, or a second PTC thermistor and an NTC thermistor connected in series with each other are connected to a connection point between the control terminal of the second switch and the second resistor.

In each of the LED drive circuits according to preferred embodiments of the present invention, if ambient temperature around the LED drive circuit fluctuates, current having a constant current value stably flows through the LED, so that the LED always emits light at constant luminance.

In addition, since each of the LED drive circuits according to preferred embodiments of the present invention can limit a current value of the current flowing through the LED when a temperature of the LED becomes abnormally high, it is possible to prevent failure of the LED due to continuous flow of the current having a high current value through the LED, and it is possible to prolong the useful life of the LED.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
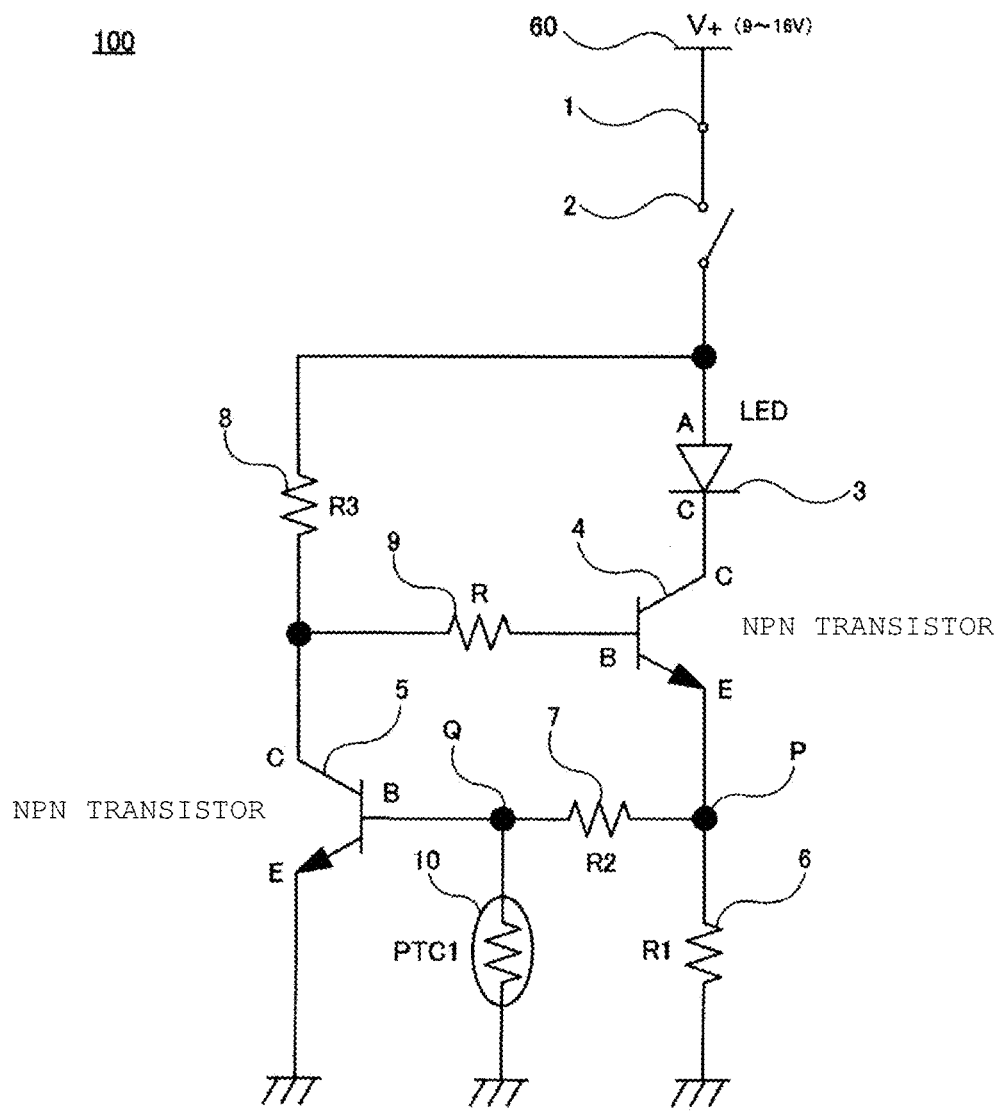
FIG. 1 is an equivalent circuit diagram of an LED drive circuit according to a first preferred embodiment of the present invention.

Hereinafter, preferred embodiments of the present invention will be described in detail with reference to the drawings.

Each preferred embodiment of the present invention illustrates an example of the present invention, and the present invention is not limited to the contents of the preferred embodiments. In addition, it is also possible to combine or replace elements and features described in different preferred embodiments. In addition, the drawings are intended to clarify understanding of the specification, and may be schematically drawn, and dimensional ratios between drawn components or components may not match the dimensional ratios of those described in the specification. In addition, for example, components described in the specification may be omitted in the drawings, or a number of components may be omitted.

First Preferred Embodiment

FIG. 1 is an equivalent circuit diagram of an LED drive circuit according to a first preferred embodiment of the present invention.

As illustrated in FIG. 1, an LED drive circuit 100 includes a power supply terminal 1, a switch 2, an LED 3, a first NPN transistor 4 as a first switching element, a second NPN transistor 5 as a second switching element, a first resistor 6, a second resistor 7, a third resistor 8, a resistor 9, and a first PTC thermistor 10.

The power supply terminal 1 is connected to a power supply 60.

The power supply 60 is a DC positive power supply. The power supply 60 is, for example, a battery mounted on an automobile. The power supply 60 uses, for example, 12 V as a reference voltage, but the voltage value fluctuates in a range of, for example, about 9 V to about 16 V depending on various conditions.

In the present preferred embodiment, a base-emitter threshold voltage of the first NPN transistor 4 and the second NPN transistor 5, which is the threshold voltage at which the first NPN transistor 4 and the second NPN transistor 5 change from an off state to an on state, is, for example, about 0.68 V at about 25° C. However, the base-emitter threshold voltage of the first NPN transistor 4 and the second NPN transistor 5 has a temperature characteristic, and every time ambient temperature around the LED drive circuit 100, that is, ambient temperature around the first NPN transistor 4 and the second NPN transistor 5 increases by about 1° C., the base-emitter threshold voltage decreases by about 0.002 V.

In the present preferred embodiment, for example, the first resistor 6 has a resistance value of about 4.7Ω. In addition, for example, the second resistor 7 has a resistance value of about 1Ω. Note that resistance values of the third resistor 8 and the resistor 9 can be appropriately set on condition that the first NPN transistor 4 is turned on when the switch 2 is turned on. Note that the resistor 9 can also be omitted.

Figure 2:
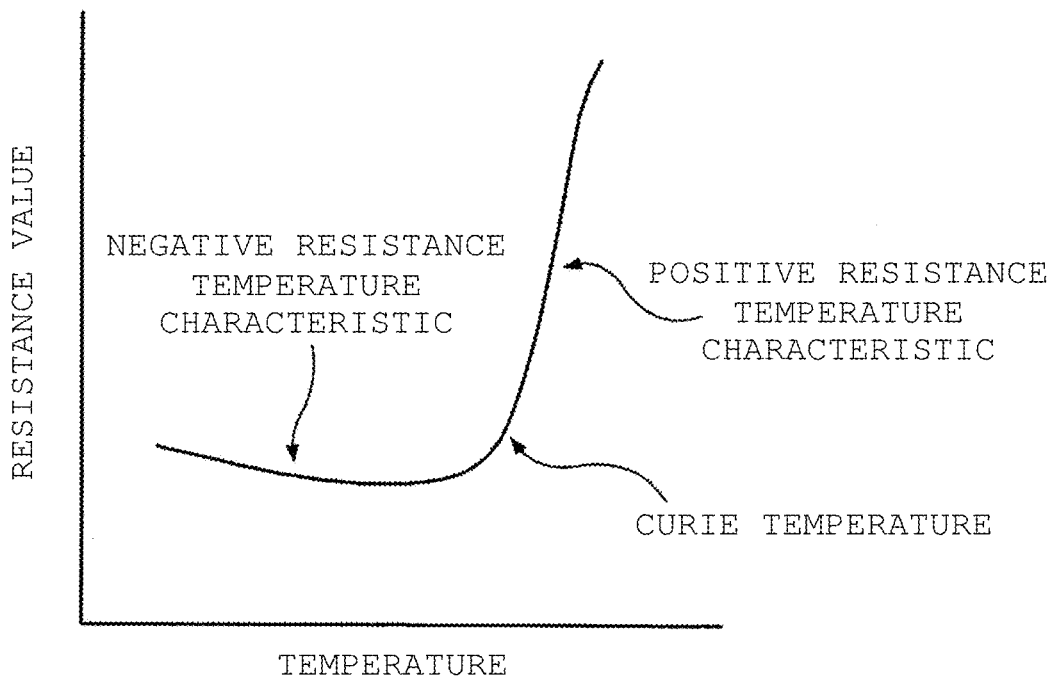
FIG. 2 is a graph illustrating a resistance temperature characteristic of a first PTC thermistor of the LED drive circuit according to the first preferred embodiment of the present invention.

In the present preferred embodiment, for example, the first PTC thermistor 10 has a resistance value of about 470Ω at about 25° C. The first PTC thermistor 10 is, for example, a ceramic PTC thermistor. The first PTC thermistor 10 includes a resistance temperature characteristic. FIG. 2 is a graph illustrating the resistance temperature characteristic of the first PTC thermistor of the LED drive circuit according to the first preferred embodiment of the present invention. As illustrated in FIG. 2, the first PTC thermistor 10 has a temperature range showing a clear positive resistance temperature characteristic at a temperature higher than the Curie temperature. On the other hand, the first PTC thermistor 10 has a temperature region showing a negative resistance temperature characteristic at a temperature lower than the Curie temperature. More specifically, the first PTC thermistor of the present preferred embodiment exhibits the negative resistance temperature characteristic at about 25° C. or more and about 90° C. or less, and exhibits the positive resistance temperature characteristic at about 125° C. or more. The resistance value of the first PTC thermistor 10 of the present preferred embodiment is about twice as large as the resistance value thereof at about 25° C., which is room temperature, at about 135° C., and is about 10 times as large as the resistance value thereof at 25° C. at about 145° C.

Note that the negative resistance temperature characteristic appearing in the temperature region lower than the Curie temperature of the PTC thermistor typically tends to appear more remarkably in a ceramic PTC thermistor than in a polymer PTC thermistor. Therefore, in the present preferred embodiment, as described above, the ceramic PTC thermistor is used as the first PTC thermistor 10.

The first PTC thermistor 10 is disposed in the vicinity of the second NPN transistor 5. Therefore, ambient temperature around the first PTC thermistor 10 is the same or substantially the same as the ambient temperature around the second NPN transistor 5. In addition, the ambient temperature around the second NPN transistor 5 and the first PTC thermistor 10 is affected by heat generated by light emission of the LED 3, and when the temperature of the LED 3 abnormally increases, the ambient temperature around the second NPN transistor 5 and the first PTC thermistor 10 also rapidly increases.

A connection relationship among the respective components of the LED drive circuit 100 is as follows.

The power supply terminal 1 is connected to one end of the switch 2.

The other end of the switch 2 is connected to each of an anode of the LED 3 and one end of the third resistor 8.

A cathode of the LED 3 is connected to a collector of the first NPN transistor 4.

An emitter of the first NPN transistor 4 is connected to each of one end of the first resistor 6 and one end of the second resistor 7. A connection point between the emitter of the first NPN transistor 4, the one end of the first resistor 6, and the one end of the second resistor 7 is a point P.

The other end of the first resistor 6 is connected to a ground.

The other end of the third resistor 8 is connected to each of one end of the resistor 9 and a collector of the second NPN transistor 5.

An emitter of the second NPN transistor 5 is connected to the ground.

The other end of the resistor 9 is connected to a base of the first NPN transistor 4. The base of the first NPN transistor 4 is a control terminal.

The other end of the second resistor 7 is connected to each of a base of the second NPN transistor 5 and one end of the first PTC thermistor 10. Note that a connection point between the other end of the second resistor 7, the base of the second NPN transistor 5, and the one end of the first PTC thermistor 10 is a point Q. The base of the second NPN transistor 5 is a control terminal.

The other end of the first PTC thermistor 10 is connected to the ground.

The LED drive circuit 100 performs the following operation when the switch 2 is turned on. However, unless otherwise specified, the ambient temperature around the second NPN transistor 5 is about 25° C., which is the room temperature.

When the switch 2 is turned on, a voltage of about 0.68 V or more is applied to the base of the first NPN transistor 4 via the third resistor 8 and the resistor 9, and the first NPN transistor 4 is turned on. As a result, current flows from the power supply terminal 1 through the LED 3 and the first resistor 6, and the LED 3 emits light.

The base-emitter threshold voltage of the second NPN transistor 5, which is the threshold voltage at which the second NPN transistor 5 changes from the off state to the on state, is about 0.68 V at about 25° C.

When voltage $V_Q$ at the point Q is about 0.68 V, which is the base-emitter threshold voltage of the second NPN transistor 5, voltage $V_P$ at the point P is about 1.39 V. At this time, a current value of the current flowing from the point P to the ground is about 298 mA. In addition, a current value of the current flowing through the LED 3 is also about 298 mA.

As described above, when the switch 2 is turned on, the current flows through the LED 3 and the first resistor 6, and the LED 3 emits light. However, when the current value of the current flowing through the LED 3 and the current value of the current flowing from the point P to the ground become about 298 mA or more, the voltage $V_Q$ at the point Q becomes about 0.68 V or more, and the second NPN transistor 5 is turned on.

Then, when the second NPN transistor 5 is turned on, the voltage applied to the base of the first NPN transistor 4 becomes less than about 0.68 V, and the first NPN transistor 4 is turned off.

Then, when the first NPN transistor 4 is turned off, the current does not flow through the LED 3 and the first resistor 6, the voltage $V_Q$ at the point Q becomes less than about 0.68 V, and the second NPN transistor 5 is turned off.

Then, when the second NPN transistor 5 is turned off, the voltage of about 0.68 V or more is applied to the base of the first NPN transistor 4, and the first NPN transistor 4 is turned on again. Then, the current flows through the LED 3 and the first resistor 6 again.

In the LED drive circuit 100, the above operation is repeated at high speed. Therefore, if the voltage value of the power supply 60 fluctuates, the current of about 298 mA always stably flows through the LED 3, and the LED stably emits light at a constant luminance.

Note that when the current of about 298 mA stably flows through the LED 3, the voltage $V_Q$ at the point Q falls within an extremely narrow range of voltage values around 0.68 V that is the base-emitter threshold voltage of the first NPN transistor 4. In the following description, this state may be referred to as a state in which the voltage $V_Q$ at the point Q is fixed at about 0.68 V.

In addition, when the current of about 298 mA stably flows through the LED 3, the voltage $V_P$ at the point P falls within an extremely narrow range of voltage values around the above-described about 1.39 V. In the following description, this state may be referred to as a state in which the voltage $V_P$ at the point P is fixed at about 1.39 V.

The above is the operation of the LED drive circuit 100 when the ambient temperature around the second NPN transistor 5 is maintained at about 25° C., which is the room temperature.

Next, the operation of the LED drive circuit 100 when the ambient temperature around the second NPN transistor 5 increases to a temperature higher than about 25° C. will be described.

As described above, the base-emitter threshold voltage of the second NPN transistor 5, which is the threshold voltage at which the second NPN transistor 5 changes from the off state to the on state, has the temperature characteristic, and every time the ambient temperature increases by about 1° C., the base-emitter threshold voltage decreases by about 0.002 V.

Then, unless some correction is performed on the decrease in the base-emitter threshold voltage of the second NPN transistor 5, the voltage $V_Q$ at the point Q becomes smaller than about 0.68 V and the voltage $V_P$ at the point P becomes smaller than about 1.39 V. Then, as a result, the current value of the current flowing through the LED 3 becomes smaller than about 298 mA, and the luminance of the LED 3 becomes lower than the design value.

Therefore, the LED drive circuit 100 uses the resistance temperature characteristic of the first PTC thermistor 10 to correct the decrease in the current value of the current flowing through the LED 3 due to the decrease in the base-emitter threshold voltage of the second NPN transistor 5 due to the increase in the ambient temperature. That is, the LED drive circuit 100 includes a temperature compensation function.

As described above, the first PTC thermistor 10 exhibits the negative resistance temperature characteristic at about 25° C. or more and about 90° C. or less, and the resistance value decreases as the ambient temperature increases. That is, when the temperature of the first PTC thermistor 10 increases from about 25° C., the resistance value of about 470Ω at about 25° C. decreases (see FIG. 2). Then, due to the decrease in the resistance value of the first PTC thermistor 10 due to the increase in the ambient temperature, the current value of the current flowing from the point Q to the ground increases, the current value of the current flowing from the point P to the ground increases, and resultantly the current value of the current flowing through the LED 3 increases.

That is, in the LED drive circuit 100, the decrease in the current value of the current flowing through the LED 3 due to the decrease in the base-emitter threshold voltage of the second NPN transistor 5 due to the increase in the ambient temperature is canceled by the increase in the current value of the current flowing through the LED 3 due to the decrease in the resistance value of the first PTC thermistor 10 due to the increase in the ambient temperature. Thus, if the ambient temperature increases, the current value of the current flowing through the LED 3 does not decrease from about 298 mA. Then, if the ambient temperature around the second NPN transistor 5 increases, the luminance of the LED 3 does not decrease. Therefore, the LED 3 stably emits light at a constant luminance.

Figure 3:
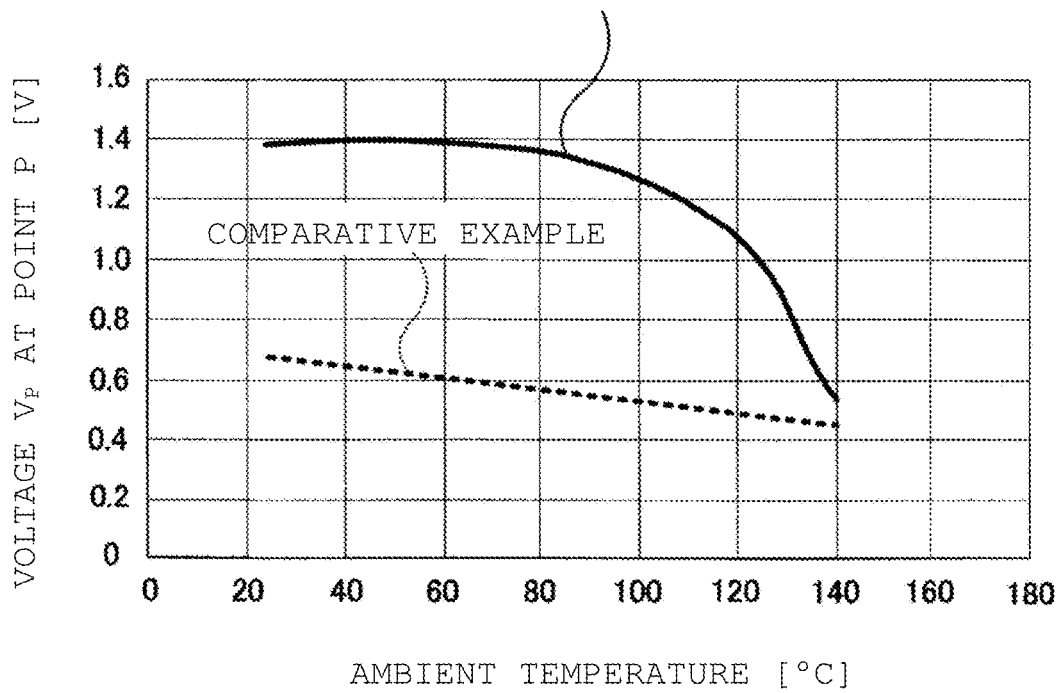
FIG. 3 is a graph illustrating a relationship between ambient temperature and voltage $V_P$ at a point P in the LED drive circuit according to the first preferred embodiment of the present invention.

FIG. 3 is a graph illustrating a relationship between the ambient temperature and the voltage $V_P$ at the point P in the LED drive circuit according to the first preferred embodiment of the present invention. In FIG. 3, a relationship between the ambient temperature around the second NPN transistor 5 and the first PTC thermistor 10 and the voltage $V_P$ at the point P in the LED drive circuit 100 is indicated by a solid line. As can be seen from FIG. 3, in the LED drive circuit 100, in the temperature range of about 25° C. or more and about 90° C. or less, if the ambient temperature around the second NPN transistor 5 and the first PTC thermistor 10 increases, the voltage $V_P$ at the point P hardly fluctuates and is flat or substantially flat.

On the other hand, as can be seen from FIG. 3, in the LED drive circuit 100, when the ambient temperature around the second NPN transistor 5 and the first PTC thermistor 10 exceeds about 120° C., the voltage $V_P$ at the point P rapidly decreases. This is because the first PTC thermistor 10 starts to exhibit the positive resistance temperature characteristic. Then, when the voltage $V_P$ at the point P decreases, the current value of the current flowing through the LED 3 decreases.

Using this characteristic, the LED drive circuit 100 prevents the temperature of the LED 3 from further increasing when the temperature of the LED 3 becomes abnormally high, and prevents the temperature of the LED 3 from reaching the junction temperature, for example, about 125° C. to about 150° C. That is, in the LED drive circuit 100, when the temperature of the LED 3 becomes abnormally high, for example, exceeding about 120° C., the ambient temperature around the second NPN transistor 5 and the first PTC thermistor 10 greatly increases, so that the voltage $V_P$ at the point P greatly decreases, and the current value of the current flowing through the LED 3 greatly decreases. Therefore, further temperature increase of the LED 3 is prevented, and the LED 3 is protected.

Experiment

In order to confirm the effectiveness of preferred embodiments of the present invention, the following experiments were performed.

The above-described LED drive circuit 100 (see FIG. 1) was manufactured as an example. In the LED drive circuit 100, as described above, the first resistor 6 has the resistance value of about 4.7Ω. In addition, the second resistor 7 has the resistance value of about 1Ω. In addition, the first PTC thermistor 10 has the resistance value of about 470Ω at about 25° C. These resistance values are shown in Table 1 below.

In addition, for comparison, an LED drive circuit according to a comparative example was manufactured. The LED drive circuit according to the comparative example has a configuration in which the second resistor 7 and the first PTC thermistor 10 are omitted from the LED drive circuit 100, and the emitter of the first NPN transistor 4 is directly connected to the base of the second NPN transistor 5. In the LED drive circuit according to the comparative example, the first resistor 6 had a resistance value of about 2.2Ω. The resistance value of the first resistor 6 is shown in Table 1. In addition, in the LED drive circuit according to the comparative example, since the second resistor 7 is omitted, a connection point between the emitter of the first NPN transistor 4, the one end of the first resistor 6, and the base of the second NPN transistor 5 is the point P.

In the example, the ambient temperature around the second NPN transistor 5 and the first PTC thermistor 10 was increased from about 22° C. to about 140° C., and the voltage $V_P$ at the point P was measured. In addition, in the comparative example, the ambient temperature around the second NPN transistor 5 was increased from about 22° C. to about 140° C., and the voltage $V_P$ at the point P was measured. In FIG. 3, a relationship between the ambient temperature around the second NPN transistor 5 and the voltage $V_P$ at the point P in the LED drive circuit according to the comparative example is indicated by a broken line.

As can be seen from FIG. 3, in the LED drive circuit according to the comparative example, the voltage $V_P$ at the point P linearly decreases as the ambient temperature around the second NPN transistor 5 increases.

In addition, in the example, the current value of the current flowing through the LED 3 was measured when the ambient temperature around the second NPN transistor 5 and the first PTC thermistor 10 was about 25° C., about 90° C., and about 135° C. In addition, also in the comparative example, the current value of the current flowing through the LED 3 was measured when the ambient temperature around the second NPN transistor 5 was about 25° C., about 90° C., and about 135° C. The respective measurement results are shown in Table 1.

TABLE 1

|  | Resistance value | | | Current value of current flowing through LED 3 at each ambient temperature | | |
| --- | --- | --- | --- | --- | --- | --- |
|  | First resistor 6 | Second resistor 7 | First PTC 10 | 25° C. | 90° C. (decrease rate) | 135° C. |
| Example | 4.7Ω | 1Ω | 470Ω (25° C.) | 298 mA | 283 mA (about 5%) | 150 mA |
| Comparative example | 2.2Ω | None | None | 309 mA | 250 mA (about 20%) | 209 mA |

The current value of the current flowing through the LED 3 of the example was about 298 mA when the ambient temperature was about 25° C., and about 283 mA when the ambient temperature was about 90° C. When the ambient temperature increased from about 25° C. to about 90° C., the current value of the current flowing through the LED 3 decreased by only about 5%. This is considered to be an advantageous effect caused by the negative resistance temperature characteristic of the first PTC thermistor 10 canceling the decrease in the current value of the current flowing through the LED 3 due to the decrease in the base-emitter threshold voltage of the second NPN transistor 5 due to the increase in the ambient temperature. On the other hand, the current value of the current flowing through the LED 3 of the comparative example was about 309 mA when the ambient temperature was about 25° C., and about 250 mA when the ambient temperature was about 90° C. As the ambient temperature increased from about 25° C. to about 90° C., the current value of the current flowing through the LED 3 decreased by about 20%.

In addition, in the example, when the ambient temperature reached about 135° C., the current value of the current flowing through the LED 3 was about 150 mA, and the current flowing through the LED 3 was reduced or prevented. Therefore, in the example, when the temperature of the LED 3 becomes abnormally high exceeding about 120° C., the current value of the current flowing through the LED 3 is reduced or prevented, and further temperature increase of the LED 3 can be reduced or prevented. On the other hand, in the comparative example, if the ambient temperature reached about 135° C., the current value of the current flowing through the LED 3 was about 209 mA, and the current flowing through the LED 3 was not reduced or prevented. Therefore, in the comparative example, if the temperature of the LED 3 becomes abnormally high exceeding about 120° C., the current value of the current flowing through the LED 3 is not reduced or prevented, the temperature of the LED 3 may continue to increase, and the temperature of the LED 3 may reach the junction temperature.

From the above experiments, the effectiveness of preferred embodiments of the present invention was able to be confirmed.

Second Preferred Embodiment

Figure 4:
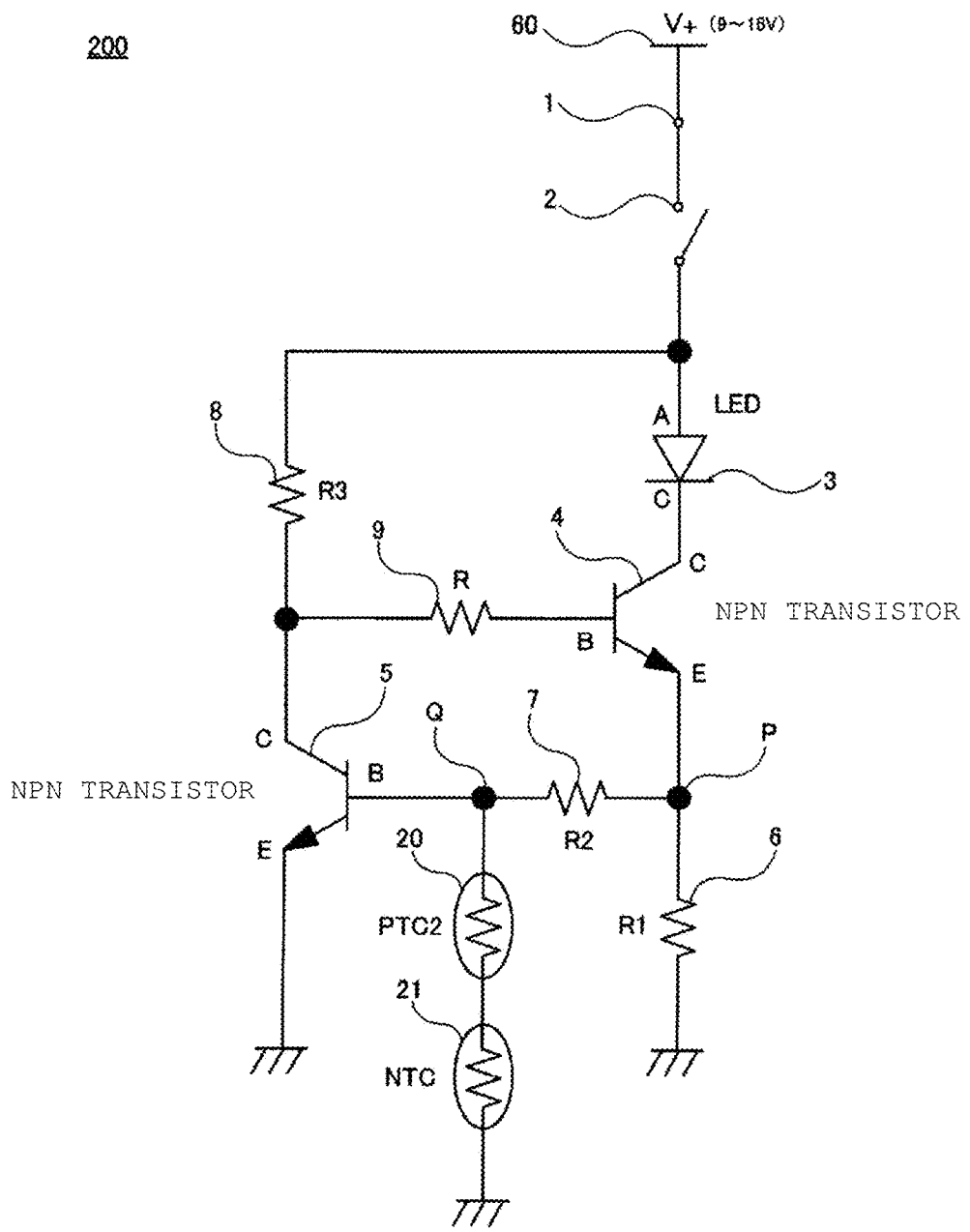
FIG. 4 is an equivalent circuit diagram of an LED drive circuit according to a second preferred embodiment of the present invention.

FIG. 4 is an equivalent circuit diagram of an LED drive circuit according to a second preferred embodiment of the present invention.

As illustrated in FIG. 4, an LED drive circuit 200 according to the second preferred embodiment is modified in a portion of the configuration of the LED drive circuit 100 according to the first preferred embodiment described above. Specifically, in the LED drive circuit 100, the first PTC thermistor 10 is connected between the point Q, which is the connection point between the other end of the second resistor 7 and the base of the second NPN transistor 5, and the ground, whereas in the LED drive circuit 200, a second PTC thermistor 20 and an NTC thermistor 21 connected in series with each other are connected between the point Q, which is the connection point between the other end of the second resistor 7 and the base of the second NPN transistor 5, and the ground. Other configurations of the LED drive circuit 200 are the same or substantially the same as those of the LED drive circuit 100.

Figure 5:
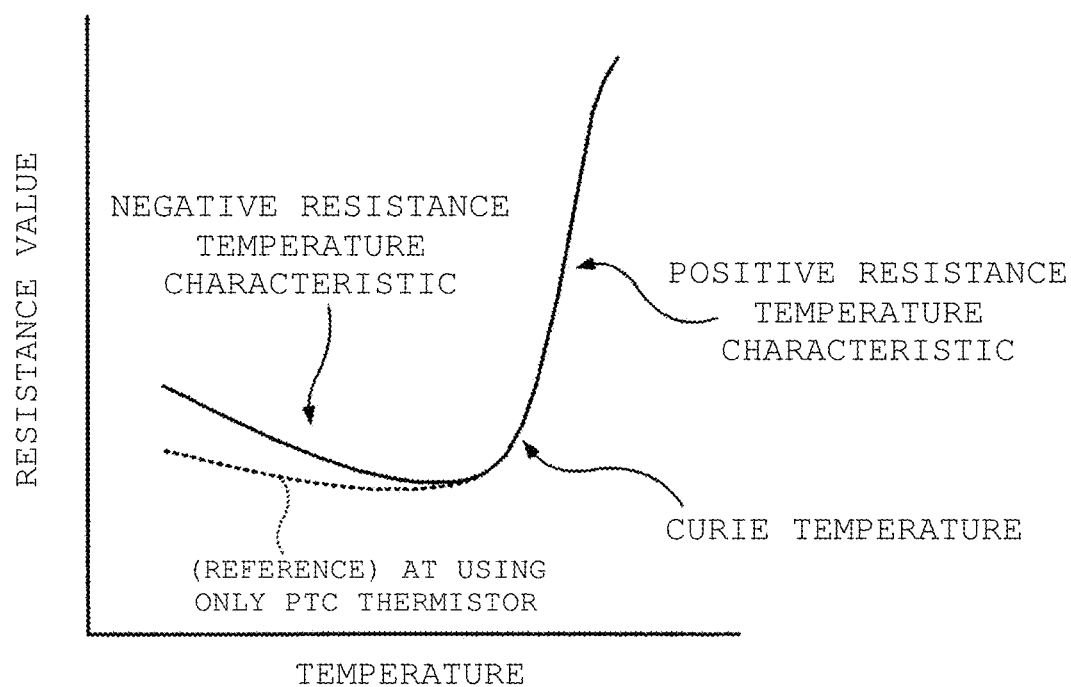
FIG. 5 is a graph illustrating a resistance temperature characteristic of a second PTC thermistor and an NTC thermistor connected in series in the LED drive circuit according to the second preferred embodiment of the present invention.

FIG. 5 is a graph illustrating a resistance temperature characteristic of the second PTC thermistor and the NTC thermistor connected in series in the LED drive circuit according to the second preferred embodiment of the present invention. In FIG. 5, a combined resistance temperature characteristic of the second PTC thermistor 20 and the NTC thermistor 21 connected in series is indicated by a solid line. In addition, for reference, the resistance temperature characteristic of the first PTC thermistor 10 of the LED drive circuit 100 according to the first preferred embodiment is indicated by a broken line. As can be seen from FIG. 5, in the combined resistance temperature characteristic of the second PTC thermistor 20 and the NTC thermistor 21 connected in series, the slope of the negative resistance temperature characteristic appearing in the temperature region lower than the Curie temperature is larger than that of the resistance temperature characteristic of the first PTC thermistor 10 of the LED drive circuit 100. Therefore, the second PTC thermistor 20 and the NTC thermistor 21 of the LED drive circuit 200 can further increase the current value of the current flowing through the LED 3 when the ambient temperature increases, as compared with the first PTC thermistor 10 of the LED drive circuit 100.

The LED drive circuit 200 is useful when the range for correcting the decrease in the current value of the current flowing through the LED 3 due to the decrease in the threshold voltage of the second NPN transistor 5 due to the increase in the ambient temperature is large.

Third Preferred Embodiment

Figure 6:
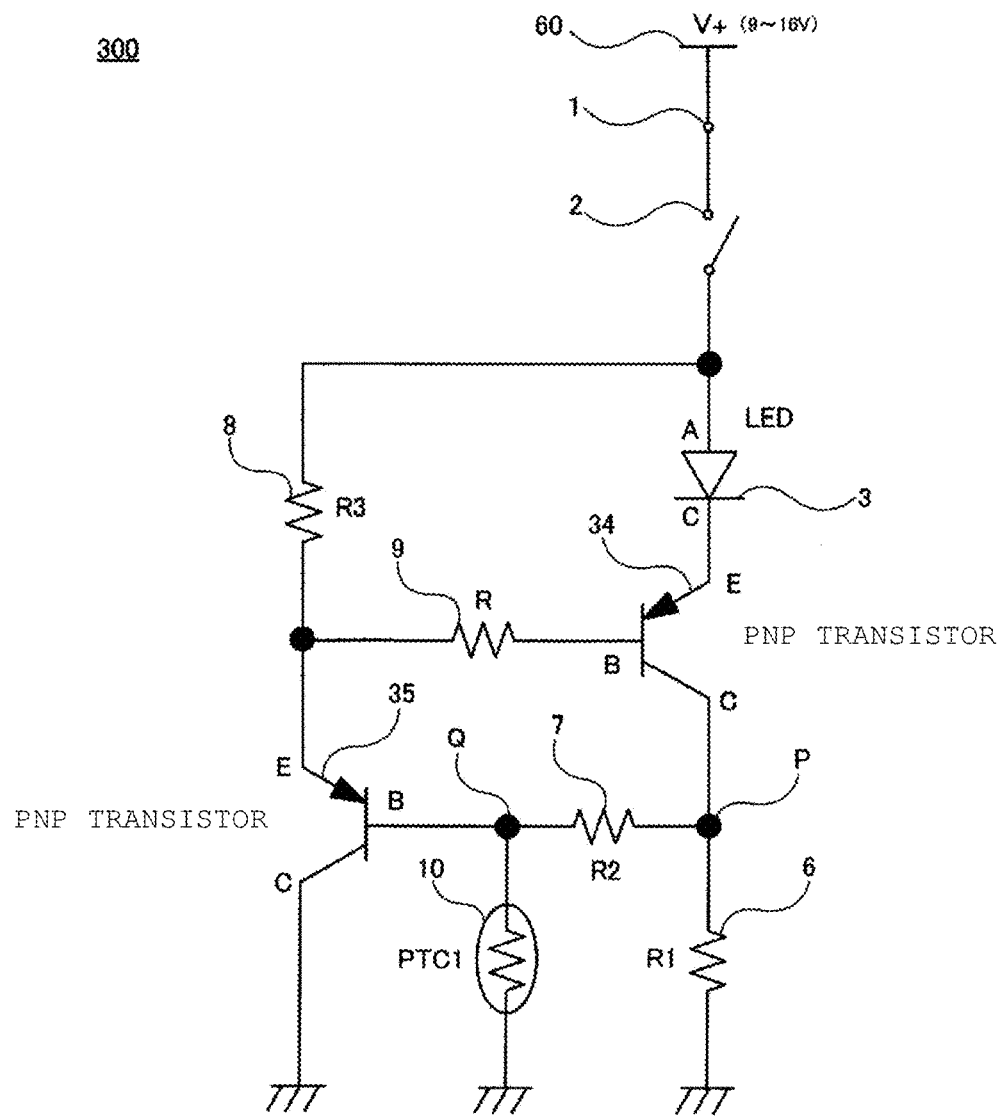
FIG. 6 is an equivalent circuit diagram of an LED drive circuit according to a third preferred embodiment of the present invention.

FIG. 6 is an equivalent circuit diagram of an LED drive circuit according to a third preferred embodiment of the present invention.

As illustrated in FIG. 6, an LED drive circuit 300 according to the third preferred embodiment is also modified in a portion of the configuration of the LED drive circuit 100 according to the first preferred embodiment described above. Specifically, in the LED drive circuit 100, the first NPN transistor 4 is the first switching element and the second NPN transistor 5 is the second switching element, whereas in the LED drive circuit 300, a first PNP transistor 34 is the first switching element and a second PNP transistor 35 is the second switching element. Other configurations of the LED drive circuit 300 are the same or substantially the same as those of the LED drive circuit 100.

In the LED drive circuit 300, the cathode of the LED 3 is connected to an emitter of the first PNP transistor 34.

In addition, a collector of the first PNP transistor 34 is connected to each of the one end of the first resistor 6 and the one end of the second resistor 7. A base of the first PNP transistor 34 is a control terminal.

In addition, the other end of the third resistor 8 is connected to each of the one end of the resistor 9 and an emitter of the second PNP transistor 35.

In addition, a collector of the second PNP transistor 35 is connected to the ground. A base of the second PNP transistor 35 is a control terminal.

Also in the LED drive circuit 300, the decrease in the current value of the current flowing through the LED 3 due to the decrease in the base-emitter threshold voltage of the second PNP transistor 35 due to the increase in the ambient temperature is canceled by the increase in the current value of the current flowing through the LED 3 due to the decrease in the resistance value of the first PTC thermistor 10 due to the increase in the ambient temperature. Therefore, if the ambient temperature increases, the current value of the current flowing through the LED 3 does not decrease, the luminance of the LED 3 does not decrease, and the LED 3 stably emits light at constant luminance. In this way, in the LED drive circuit 300, the resistance temperature characteristic of the first PTC thermistor 10 is used to correct the decrease in the current value of the current flowing through the LED 3 due to the decrease in the base-emitter threshold voltage of the second PNP transistor 35 due to the increase in the ambient temperature. That is, the LED drive circuit 300 includes a temperature compensation function.

Fourth Preferred Embodiment

Figure 7:
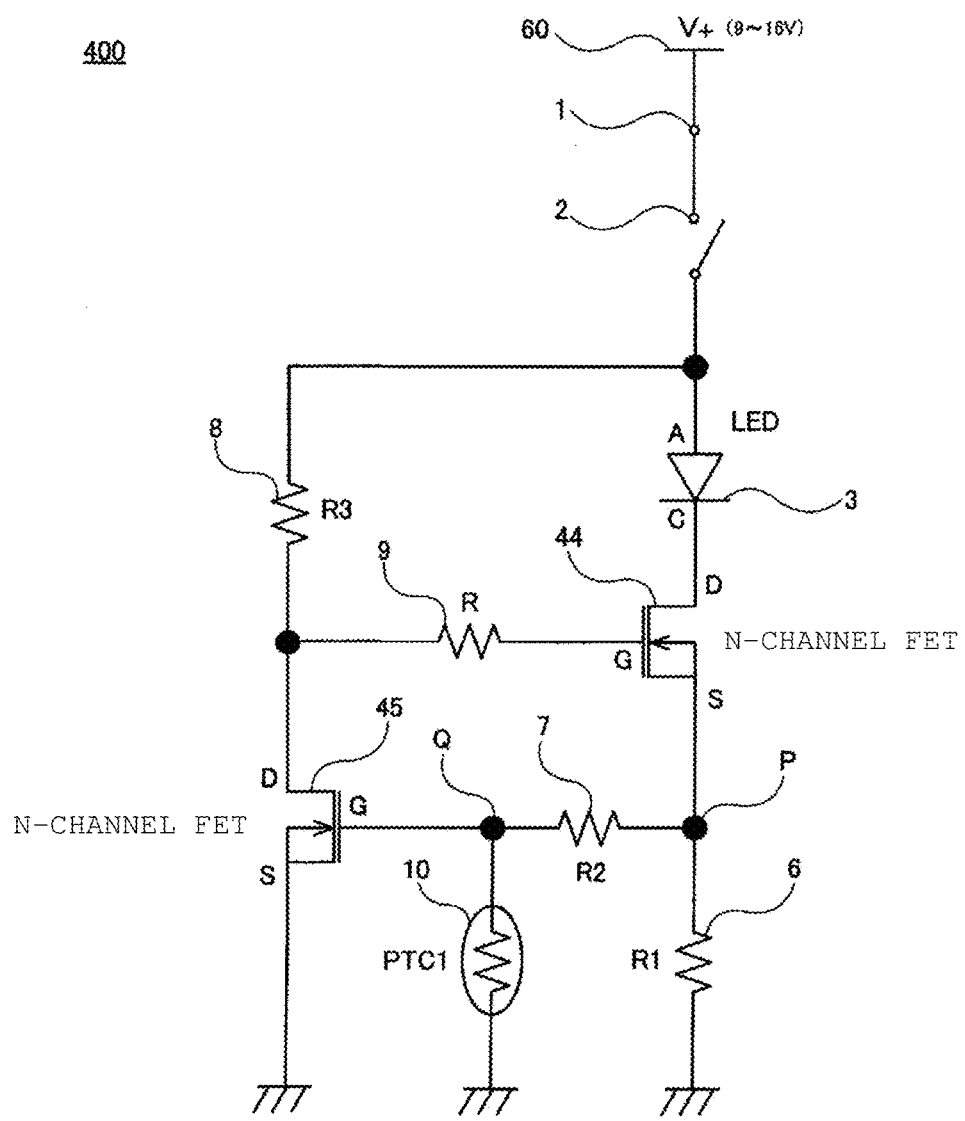
FIG. 7 is an equivalent circuit diagram of an LED drive circuit according to a fourth preferred embodiment of the present invention.

FIG. 7 is an equivalent circuit diagram of an LED drive circuit according to a fourth preferred embodiment of the present invention.

As illustrated in FIG. 7, an LED drive circuit 400 according to the fourth preferred embodiment is also modified in a portion of the configuration of the LED drive circuit 100 according to the first preferred embodiment described above. Specifically, in the LED drive circuit 100, the first NPN transistor 4 is the first switching element and the second NPN transistor 5 is the second switching element, whereas in the LED drive circuit 400, a first N-channel FET 44 is the first switching element and a second N-channel FET 45 is the second switching element. Other configurations of the LED drive circuit 400 are the same or substantially the same as those of the LED drive circuit 100.

In the LED drive circuit 400, the cathode of the LED 3 is connected to a drain of the first N-channel FET 44.

In addition, a source of the first N-channel FET 44 is connected to each of the one end of the first resistor 6 and the one end of the second resistor 7.

In addition, the other end of the third resistor 8 is connected to each of the one end of the resistor 9 and a drain of the second N-channel FET 45.

In addition, the other end of the resistor 9 is connected to a gate of the first N-channel FET 44. The gate of the first N-channel FET 44 is a control terminal.

In addition, the other end of the second resistor 7 is connected to each of a gate of the second N-channel FET 45 and the one end of the first PTC thermistor 10. The gate of the second N-channel FET 45 is a control terminal.

In addition, a source of the second N-channel FET 45 is connected to the ground.

Also in the LED drive circuit 400, the decrease in the current value of the current flowing through the LED 3 due to the decrease in gate-source threshold voltage of the second N-channel FET 45 due to the increase in the ambient temperature is canceled by the increase in the current value of the current flowing through the LED 3 due to the decrease in the resistance value of the first PTC thermistor 10 due to the increase in the ambient temperature. Therefore, if the ambient temperature increases, the current value of the current flowing through the LED 3 does not decrease, the luminance of the LED 3 does not decrease, and the LED 3 stably emits light at a constant luminance. In this way, in the LED drive circuit 400, the resistance temperature characteristic of the first PTC thermistor 10 is used to correct the decrease in the current value of the current flowing through the LED 3 due to the decrease in the gate-source threshold voltage of the second N-channel FET 45 due to the increase in the ambient temperature. That is, the LED drive circuit 400 includes a temperature compensation function.

Fifth Preferred Embodiment

Figure 8:
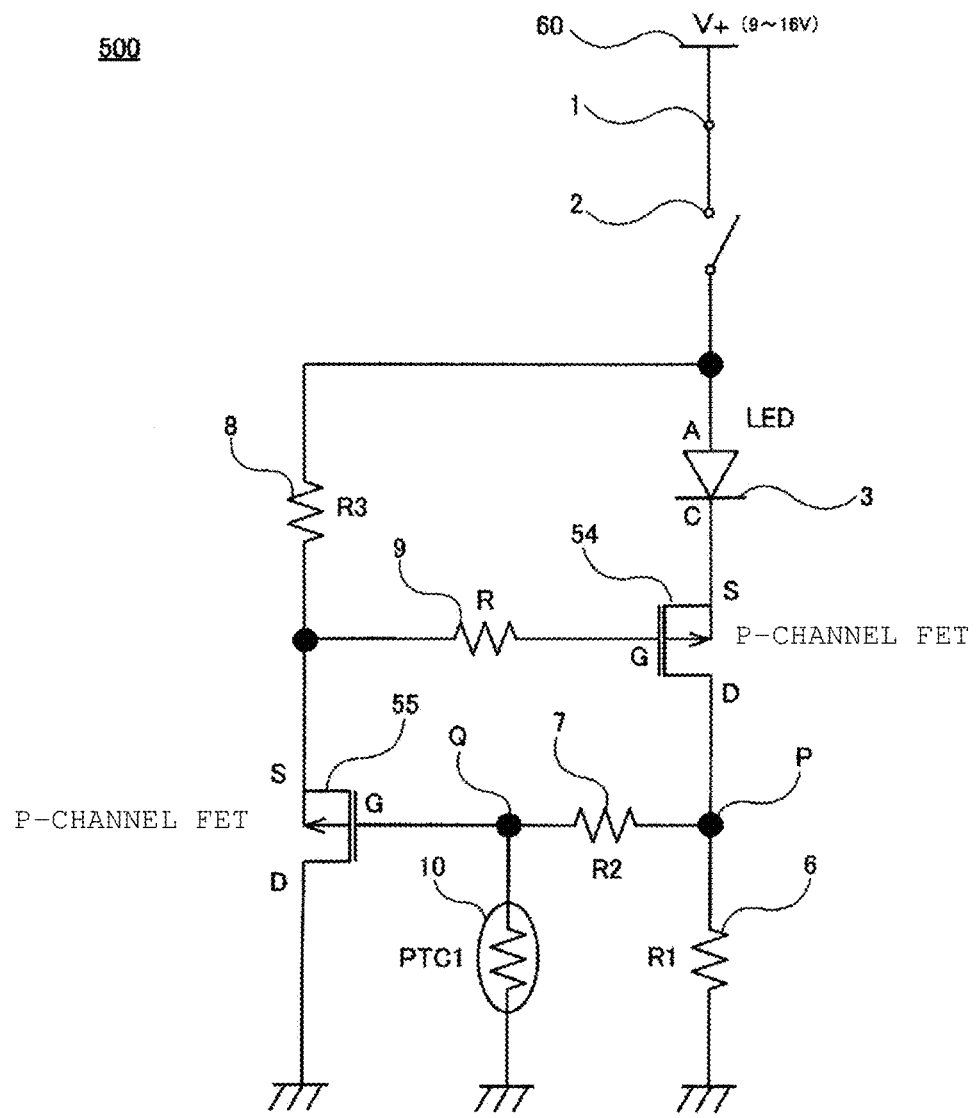
FIG. 8 is an equivalent circuit diagram of an LED drive circuit according to a fifth preferred embodiment of the present invention.
Figure 9:
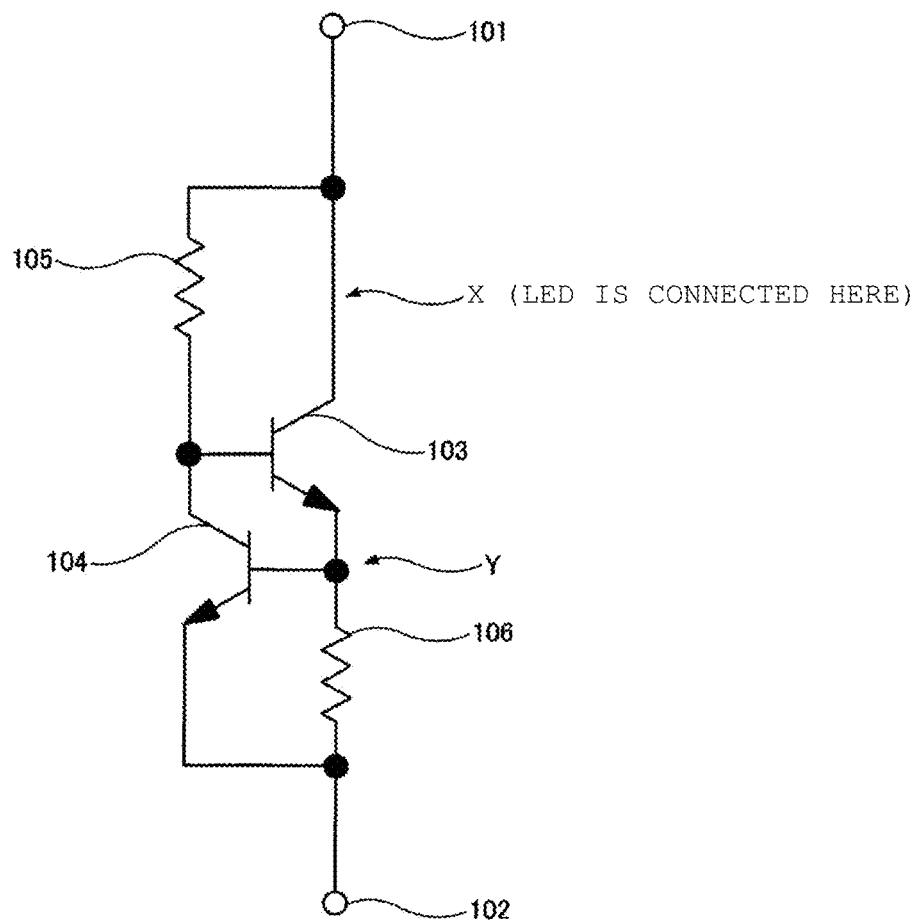
FIG. 9 is an equivalent circuit diagram of a constant current circuit disclosed in Japanese Patent No. 5079858.

FIG. 8 is an equivalent circuit diagram of an LED drive circuit 500 according to a fifth preferred embodiment of the present invention.

As illustrated in FIG. 8, the LED drive circuit 500 according to the fifth preferred embodiment is also modified in a portion of the configuration of the LED drive circuit 100 according to the first preferred embodiment described above. Specifically, in the LED drive circuit 100, the first NPN transistor 4 is the first switching element and the second NPN transistor 5 is the second switching element, whereas in the LED drive circuit 500, a first P-channel FET 54 is the first switching element and a second P-channel FET 55 is the second switching element. Other configurations of the LED drive circuit 500 are the same or substantially the same as those of the LED drive circuit 100.

In the LED drive circuit 500, the cathode of the LED 3 is connected to a source of the first P-channel FET 54.

In addition, a drain of the first P-channel FET 54 is connected to each of the one end of the first resistor 6 and the one end of the second resistor 7.

In addition, the other end of the third resistor 8 is connected to each of the one end of the resistor 9 and a source of the second P-channel FET 55.

In addition, the other end of the resistor 9 is connected to a gate of the first P-channel FET 54. The gate of the first P-channel FET 54 is a control terminal.

In addition, the other end of the second resistor 7 is connected to each of a gate of the second P-channel FET 55 and the one end of the first PTC thermistor 10. The gate of the second P-channel FET 55 is a control terminal.

In addition, a drain of the second P-channel FET 55 is connected to the ground.

Also in the LED drive circuit 500, the decrease in the current value of the current flowing through the LED 3 due to the decrease in gate-source threshold voltage of the second P-channel FET 55 due to the increase in the ambient temperature is canceled by the increase in the current value of the current flowing through the LED 3 due to the decrease in the resistance value of the first PTC thermistor 10 due to the increase in the ambient temperature. Therefore, if the ambient temperature increases, the current value of the current flowing through the LED 3 does not decrease, the luminance of the LED 3 does not decrease, and the LED 3 stably emits light at constant luminance. In this way, in the LED drive circuit 500, the resistance temperature characteristic of the first PTC thermistor 10 is used to correct the decrease in the current value of the current flowing through the LED 3 due to the decrease in the gate-source threshold voltage of the second P-channel FET 55 due to the increase in the ambient temperature. That is, the LED drive circuit 500 includes a temperature compensation function.

The LED drive circuits 100, 200, 300, 400, and 500 according to the first to fifth preferred embodiments have been described above. However, the present invention is not limited to the contents described above, and various modifications can be made.

For example, in each of the above preferred embodiments, the same type of semiconductor elements (for example, the NPN transistor and the NPN transistor) are used for the first switching element and the second switching element, but different types of semiconductor elements (for example, the NPN transistor and the PNP transistor) may be used for the first switching element and the second switching element.

In addition, other electronic component elements, such as a capacitor, a coil, and a resistor may be further added to the circuit of each of the above preferred embodiments.

An LED drive circuit according to a preferred embodiment of the present invention is described in the Summary of the Invention.

In this LED drive circuit, it is also preferable that the first switching element includes the first NPN transistor including the NPN transistor, the first PNP transistor including the PNP transistor, the first N-channel FET including the N-channel FET, the first P-channel FET including the P-channel FET, or the like, for example. In addition, it is also preferable that the second switching element includes the second NPN transistor including the NPN transistor, the second PNP transistor including the PNP transistor, the second N-channel FET including the N-channel FET, and the second P-channel FET including the P-channel FET, or the like, for example.

In addition, it is also preferable that the first PTC thermistor, or the second PTC thermistor and the NTC thermistor connected in series with each other exhibit the negative resistance temperature characteristic at a temperature of about 25° C. or more and about 90° C. or less, and exhibit the positive resistance temperature characteristic at a temperature of about 125° C. or more. In this case, it is possible to satisfactorily correct the decrease in the current value of the current flowing through the LED due to the decrease in the threshold voltage of the second switching element due to the increase in the ambient temperature around the second switching element. In addition, when the temperature of the LED becomes abnormally high, the current value of the current flowing through the LED can be satisfactorily limited.

In addition, it is also preferable that the first PTC thermistor or the second PTC thermistor is a ceramic PTC thermistor. In this case, it is possible to satisfactorily correct the decrease in the current value of the current flowing through the LED due to the decrease in the threshold voltage of the second switching element due to the increase in the ambient temperature around the second switching element.

It is also preferable that the power supply connected to the power supply terminal is a battery. The voltage of the battery is likely to fluctuate, but also in this case, the current having a constant current value flows through the LED, and the luminance of the LED can be maintained constant.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LED drive circuit comprising:
   a power supply terminal;
   an LED;
   a first switch;
   a second switch;
   a first resistor;
   a second resistor; and
   a third resistor; wherein
   the power supply terminal, the LED, the first switch, and the first resistor are connected in series;
   the power supply terminal, the third resistor, and the second switch are connected in series;
   a connection point between the third resistor and the second switch, and a control terminal of the first switch are connected;
   the second resistor is connected between a connection point between the first switch and the first resistor, and a control terminal of the second switch; and
   a first PTC thermistor, or a second PTC thermistor and an NTC thermistor connected in series with each other are connected to a connection point between the control terminal of the second switch and the second resistor.

2. The LED drive circuit according to claim 1, wherein the first switch includes a first NPN transistor;
   the second switch includes a second NPN transistor;
   the power supply terminal is connected to an anode of the LED;
   a cathode of the LED is connected to a collector of the first NPN transistor;
   an emitter of the first NPN transistor is connected to each of a first end of the first resistor and a first end of the second resistor;
   the power supply terminal is connected to a collector of the second NPN transistor via the third resistor;
   a connection point between the third resistor and the collector of the second NPN transistor, and a base of the first NPN transistor are connected;
   a second end of the second resistor is connected to a base of the second NPN transistor; and the first PTC thermistor, or the second PTC thermistor and the NTC thermistor connected in series with each other are connected to a connection point between the second end of the second resistor and the base of the second NPN transistor.

3. The LED drive circuit according to claim 1, wherein
the first switch includes a first PNP transistor;
the second switch includes a second PNP transistor;
the power supply terminal is connected to an anode of the LED;
a cathode of the LED is connected to an emitter of the first PNP transistor;
a collector of the first PNP transistor is connected to each of a first end of the first resistor and a first end of the second resistor;
the power supply terminal is connected to an emitter of the second PNP transistor via the third resistor;
a connection point between the third resistor and the emitter of the second PNP transistor, and a base of the first PNP transistor are connected;
a second end of the second resistor is connected to a base of the second PNP transistor; and
the first PTC thermistor, or the second PTC thermistor and the NTC thermistor connected in series with each other are connected to a connection point between the second end of the second resistor and the base of the second PNP transistor.

4. The LED drive circuit according to claim 1, wherein
the first switch includes a first N-channel FET;
the second switch includes a second N-channel FET;
the power supply terminal is connected to an anode of the LED;
a cathode of the LED is connected to a drain of the first N-channel FET;
a source of the first N-channel FET is connected to each of a first end of the first resistor and a first end of the second resistor;
the power supply terminal is connected to a drain of the second N-channel FET via the third resistor;
a connection point between the third resistor and the drain of the second N-channel FET, and a gate of the first N-channel FET are connected;
a second end of the second resistor is connected to a gate of the second N-channel FET; and
the first PTC thermistor, or the second PTC thermistor and the NTC thermistor connected in series with each other are connected to a connection point between the other end of the second resistor and the gate of the second N-channel FET.

5. The LED drive circuit according to claim 1, wherein
the first switch includes a first P-channel FET;
the second switch includes a second P-channel FET;
the power supply terminal is connected to an anode of the LED;
a cathode of the LED is connected to a source of the first P-channel FET;
a drain of the first P-channel FET is connected to each of a first end of the first resistor and a first end of the second resistor;
the power supply terminal is connected to a source of the second P-channel FET via the third resistor;
a connection point between the third resistor and the source of the second P-channel FET, and a gate of the first P-channel FET are connected;
a second end of the second resistor is connected to a gate of the second P-channel FET; and
the first PTC thermistor, or the second PTC thermistor and the NTC thermistor connected in series with each other are connected to a connection point between the other end of the second resistor and the gate of the second P-channel FET.

6. The LED drive circuit according to claim 1, wherein the first PTC thermistor, or the second PTC thermistor and the NTC thermistor connected in series with each other have a negative resistance temperature characteristic at a temperature of about 25° C. or more and about 90° C. or less, and have a positive resistance temperature characteristic at a temperature of about 125° C. or more.

7. The LED drive circuit according to claim 1, wherein the first PTC thermistor or the second PTC thermistor is a ceramic PTC thermistor.

8. The LED drive circuit according to claim 1, wherein the power supply terminal is connected to a power supply.

9. The LED drive circuit according to claim 8, wherein the power supply is a DC positive power supply.

10. The LED drive circuit according to claim 2, wherein a base-emitter threshold voltage of the first and second NPN transistors is about 0.68 V.

11. The LED drive circuit according to claim 1, wherein the first resistor has a resistance value of about 4.7Ω.

12. The LED drive circuit according to claim 1, wherein the second resistor has a resistance value of about 1Ω.

13. The LED drive circuit according to claim 1, wherein the first PTC thermistor has a resistance value of about 470Ω at about 25° C.

* * * * *